United States Patent
King

(10) Patent No.: US 8,405,382 B2
(45) Date of Patent: Mar. 26, 2013

(54) SELECTABLE DELTA OR WYE VOLTAGE CONFIGURATION FOR POWER MEASUREMENT

(75) Inventor: Michael Patrick King, Pittsburgh, PA (US)

(73) Assignee: Eaton Corporation, Cleveland, OH (US)

( * ) Notice: Subject to any disclaimer, the term of this patent is extended or adjusted under 35 U.S.C. 154(b) by 541 days.

(21) Appl. No.: 12/581,360

(22) Filed: Oct. 19, 2009

(65) Prior Publication Data

US 2011/0089934 A1    Apr. 21, 2011

(51) Int. Cl.
*G01R 11/32* (2006.01)
*G01R 19/00* (2006.01)
*G01R 15/00* (2006.01)

(52) U.S. Cl. .................. 324/142; 324/76.11; 702/57

(58) Field of Classification Search .............. 324/147 R, 324/141–142; 363/125; 702/57–60
See application file for complete search history.

(56) References Cited

U.S. PATENT DOCUMENTS

| | | | | |
|---|---|---|---|---|
| 3,775,662 A * | 11/1973 | Compoly et al. | ............... | 363/43 |
| 6,112,159 A * | 8/2000 | Bond et al. | ...................... | 702/61 |
| 6,198,178 B1 * | 3/2001 | Schienbein et al. | ............ | 307/82 |
| 6,377,037 B1 * | 4/2002 | Burns et al. | .................... | 324/142 |
| 6,748,344 B2 * | 6/2004 | Mendoza et al. | ............. | 702/189 |
| 7,106,045 B2 * | 9/2006 | Jungwirth et al. | ............ | 324/113 |
| 7,345,488 B2 * | 3/2008 | Fischer | ......................... | 324/521 |
| 7,352,076 B1 * | 4/2008 | Gabrys | .......................... | 290/44 |
| 7,991,588 B1 * | 8/2011 | Krieger | ......................... | 702/186 |
| 8,005,637 B2 * | 8/2011 | Bengtsson et al. | ............ | 702/117 |
| 8,160,824 B2 * | 4/2012 | Spanier et al. | .................. | 702/57 |
| 8,165,835 B1 * | 4/2012 | Singh et al. | .................... | 702/64 |
| 8,188,726 B2 * | 5/2012 | Chimento et al. | ......... | 324/76.11 |
| 8,190,381 B2 * | 5/2012 | Spanier et al. | .................. | 702/60 |
| 8,207,726 B2 * | 6/2012 | Vaswani et al. | ................. | 324/66 |
| 2009/0322314 A1 * | 12/2009 | Long et al. | .................... | 324/142 |

\* cited by examiner

*Primary Examiner* — Joshua Benitez Rosario

(74) *Attorney, Agent, or Firm* — Dawn C. Wolff

(57) ABSTRACT

Apparatus and methods for providing a voltage signal indicative of the voltage being supplied by each phase of a multiphase voltage being supplied to a load. For each phase, a phase to neutral voltage is produced by providing a virtual ground. For each phase, a phase to phase voltage is produced by determining a difference between a pair of phase to neutral voltages. Either the phase to neutral voltages or the phase to phase voltages for each phase are output depending on the configuration of the multiphase voltage being supplied to the load.

15 Claims, 4 Drawing Sheets

SELECTABLE DELTA OR WYE VOLTAGE CONFIGURATION FOR POWER MEASUREMENT

BACKGROUND

Typically, three phase power is supplied to industry in a wye configuration, which includes three conductors and a neutral. In a wye configuration, the voltage supplied to a load is determined as between a conductor and the neutral. However, in some instances, three phase power is supplied in a delta configuration, which includes three conductors but no neutral. In a delta configuration the voltage supplied to a load is determined as between pairs of conductors. When calculating an amount of power being consumed by a load, power metering equipment takes into consideration which of the voltage configurations is in use. Usually power metering equipment is designed to calculate power consumption based on a wye configuration. If the supplied voltage is in a delta configuration, transformers are used to step the phase voltages down to simulate a wye configuration for input to the power metering equipment and to supply a ground connection for the wye voltages.

SUMMARY

A voltage configuration selector that can be used with a power meter is provided. The voltage configuration selector includes virtual grounds for first and second input voltages, respectively, of a multiphase voltage being supplied to the load, to produce first and second wye voltages, respectively. A first voltage differentiator inputs the first and second wye voltages and outputs a first delta voltage that is calculated as a difference between the first and second wye voltages. An output voltage selector receives the first wye voltage and the first delta voltage and selectively outputs either the first wye voltage or the first delta voltage.

In one example embodiment, the virtual ground provides a virtual ground for a third input voltage of the multiphase voltage being supplied to the load to produce a third wye voltage. A second voltage differentiator inputs the second and third wye voltages and outputs a second delta voltage that is calculated as a difference between the second and third wye voltages. A third voltage differentiator inputs the third and first wye voltages and outputs a third delta voltage that is calculated as a difference between the third and first wye voltages. An output voltage selector receives the first, second, and third wye voltages and the first, second, and third delta voltages and selectively outputs either the first, second, and third wye voltages or the first, second, and third delta voltages for output.

A power meter is provided that calculates power being supplied to a load. The power meter includes an ammeter that measures current being supplied to the load on each phase of a multiphase voltage being supplied to a load and provides a current signal indicative of the measured current. A voltage configuration selector provides a voltage signal indicative of the voltage being supplied by each phase of the multiphase voltage being supplied to the load. The voltage configuration selector is configured to selectively output, for each phase, based on a configuration of the multiphase voltage being supplied to the load, a voltage signal corresponding to either a phase to phase voltage or a phase to neutral voltage. The voltage configuration selector does not require a transformer to convert between a phase to phase voltage and a phase to neutral voltage. A power calculation component calculates the power being consumed by the load based, at least in part, on the current signal and the voltage signal.

A voltage configuration selection method is provided. The method includes providing a virtual ground for first, second, and third input voltages, respectively, of a multiphase voltage being supplied to the load, to produce first, second, and third wye voltages, respectively. A first delta voltage is produced by determining a difference between the first and second wye voltages. A second delta voltage is produced by determining a difference between the second and third wye voltages. A third delta voltage is produced by determining a difference between the third and first wye voltages. Either the first, second, and third wye voltages or the first, second, and third delta voltages are selectively output.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1A:
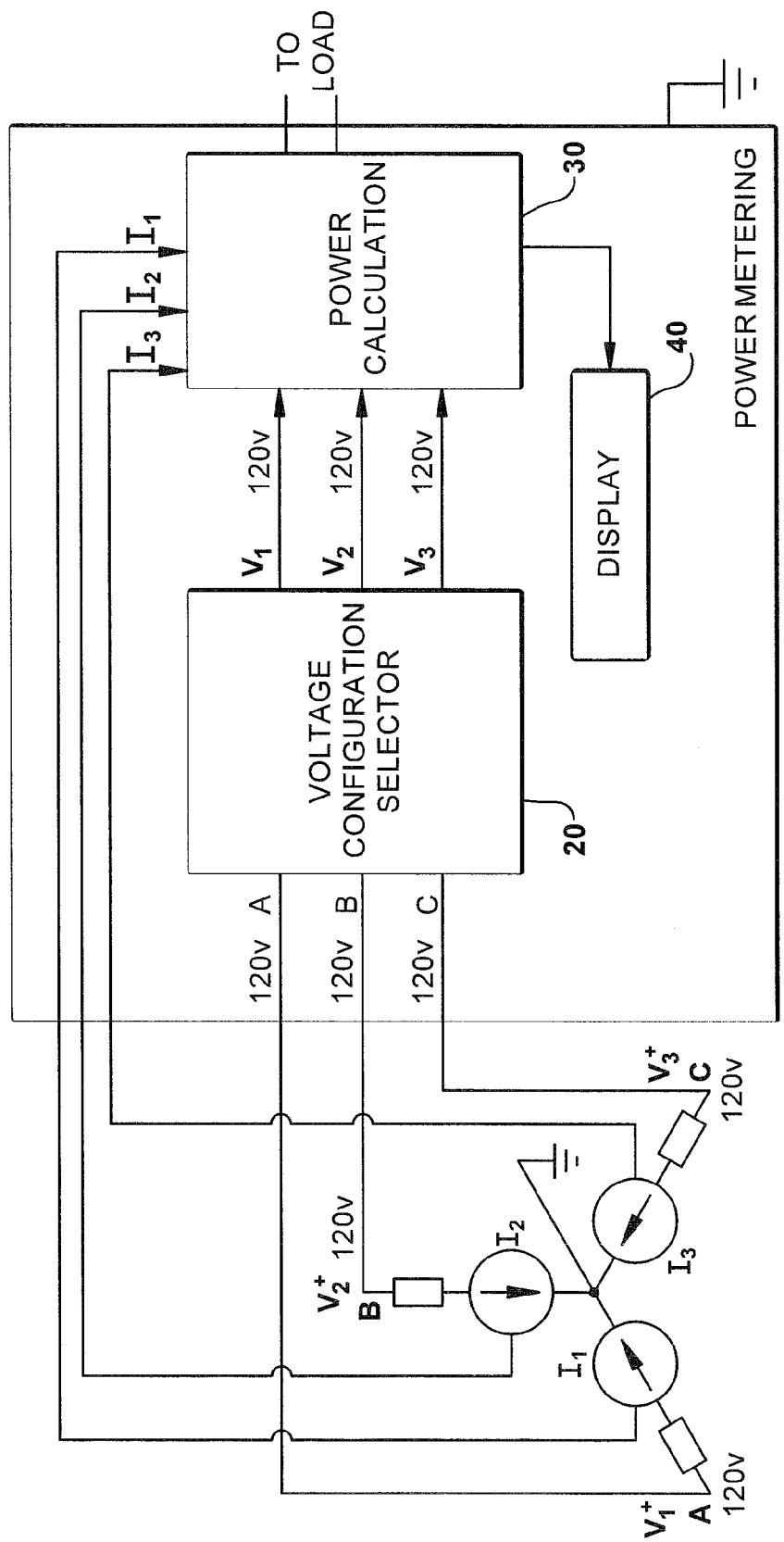
FIG. 1A is a functional block diagram of an example embodiment of a power metering system that includes a voltage configuration selector acting upon a load voltage being supplied in a wye configuration.

FIG. 1A illustrates a power metering system 10 that monitors power from a power source that is being supplied to a load. In the example illustrated in FIG. 1A, the power being supplied by the power source is three phase power that is being supplied to a load in a wye configuration, such that the load is connected between a leg of wye voltage circuit and ground. The conductors associated with the three phases of the supplied power are labeled A, B, and C. In a typical system, the voltage sensed on each conductor with respect to ground is approximately 120 V.

The power metering system 10 includes a voltage configuration selector 20, a power calculation component 30, and a display component 40. In some embodiments, the power metering system may not include a display component 40, but rather may simply transmit the metered power value to another component. The power calculation component 30 inputs a sensed current $I_1, I_2, I_3$ on each of the conductors and sensed voltages $V_1, V_2, V_3$ output by the voltage configuration selector 20. The power calculation component 30 calculates the power being consumed by the load based, at least in part, on the input current values $I_1, I_2, I_3$ and the voltage values $V_1, V_2, V_3$ and outputs the calculated power to the display 40 and/or other system components (not shown).

The power calculation component 40 typically does not have the capability to adapt its operation based on whether the voltage is being supplied to the load in a delta or wye configuration. As will be described in more detail with respect to FIG. 3, the voltage configuration selector 20 is configured to output a sensed voltage that corresponds to a selected voltage configuration. Hence, in FIG. 1A, where the load is connected in a wye configuration, the sensed voltages $V_1, V_2, V_3$ that are output by the voltage configuration selector are approximately 120V.

Figure 1B:
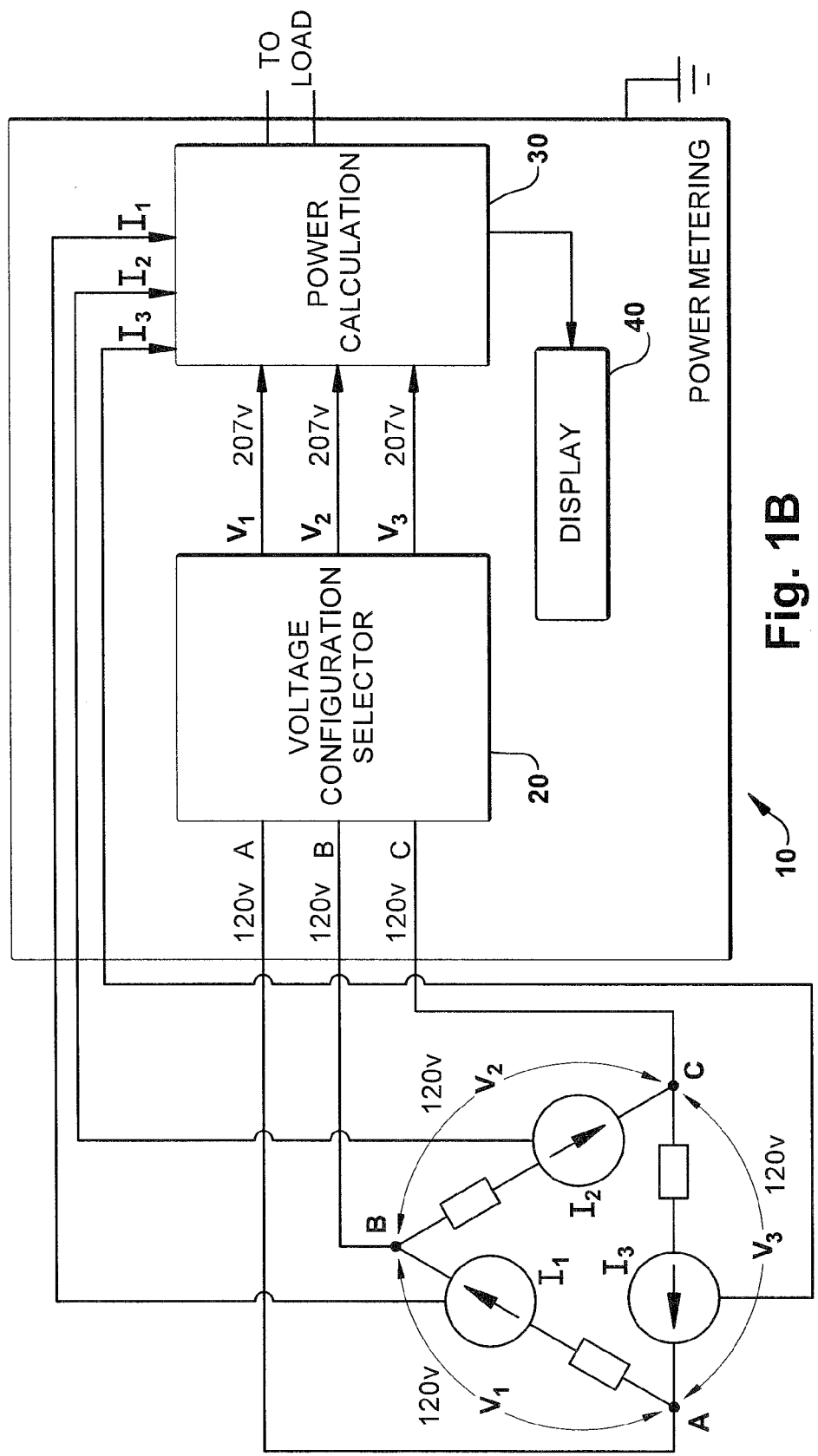
FIG. 1B is a functional block diagram of an example embodiment of a power metering system that includes a voltage configuration selector acting upon a load voltage being supplied in a delta configuration.

FIG. 1B illustrates the power metering system 10 also shown in FIG. 1A. In the example illustrated in FIG. 1B, power from a power source is being supplied to a load in a delta configuration such that the load is connected between legs of the three phase input voltage. The conductors associated with the three phases of the supplied power are labeled A, B, and C. In a typical system, the voltage sensed on each conductor with respect to ground is approximately 120 V.

As will be described in more detail with respect to FIG. 3, the voltage configuration selector 20 is configured to output a sensed voltage that corresponds to a selected voltage configuration. Hence, in FIG. 1B, where the load is connected in a delta configuration, the sensed voltages are output as approximately 207V.

Figures 2A, 2B:
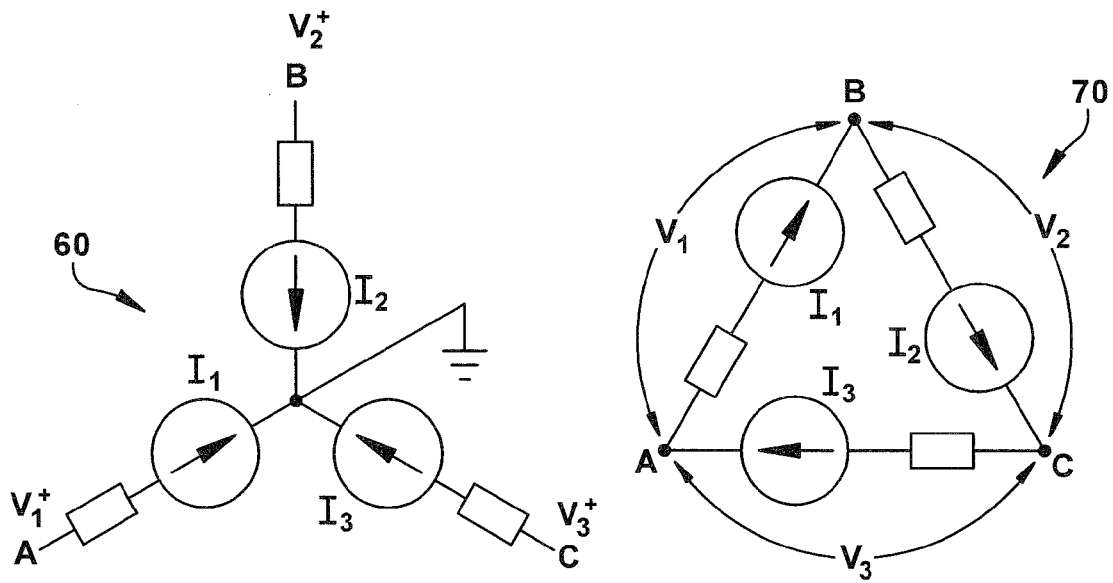
FIGS. 2A and 2B are schematic circuit diagrams illustrating a standard power metering component input convention used with wye and delta voltage configurations, respectively.

FIGS. 2A and 2B illustrate the default input configuration for one example power calculation component 40, a MAXQ3180 integrated circuit device sold by Maxim Integrated Products, Incorporated. In both figures, the power supplied by conductor A is calculated as $I_1 \times V_1$, the power supplied by conductor B is calculated as $I_2 \times V_2$, and the power supplied by conductor C is calculated as $I_3 \times V_3$. As shown in FIG. 2A, when the voltage is being supplied in a wye configuration, the voltages $V_1, V_2, V_3$ are assumed to be measured as between the conductor and ground. As shown in FIG. 2B, when the voltage is being supplied in a delta configuration, the sensing voltages $V_1, V_2, V_3$ are assumed to be measured as a difference between conductor voltages.

Thus, if the load is connected between conductors A and B in a delta configuration voltage but the voltage $V_1$ is measured between A and ground, the power will be calculated by the power calculation component 30 incorrectly. Likewise, if the load is connected to conductor A and ground in a wye configuration voltage but the voltage $V_1$ is measured between A and B, the power will be calculated incorrectly. Typically, when a power calculation component is configured to calculate power assuming a given voltage configuration (delta or wye) and the voltage is actually being supplied in the other voltage configuration (delta or wye), an external PT transformer is used to convert the conductor voltage to the proper configuration prior to inputting the voltage to the power calculation component.

Returning to FIGS. 1A and 1B, the voltage configuration selector 20 inputs the voltage on the conductors A, B, and C and outputs sensing voltages $V_1, V_2, V_3$ that correspond to either delta or wye voltages depending on which configuration has been selected. The sensing voltage configuration can be selected, for example, by actuating a switch (not shown) on the voltage configuration selector 20. Thus, the voltage configuration selector 20 may eliminate the need for external transformers by generating and providing the appropriate sensing voltages $V_1, V_2, V_3$ to the power calculation component 30 as will be described in more detail in connection with FIGS. 3 and 4.

Figure 3:
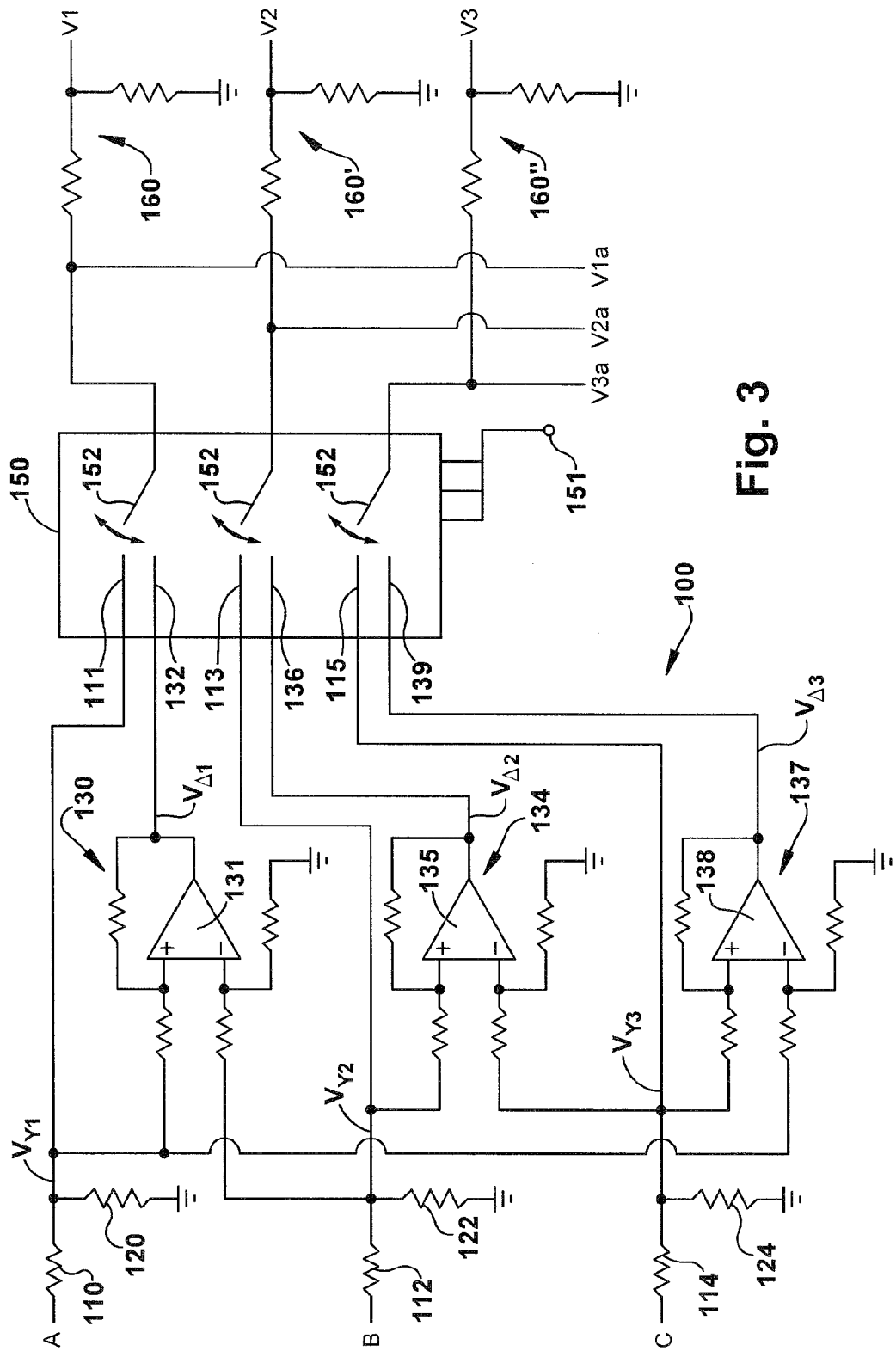
FIG. 3 is a schematic circuit diagram illustrating an example embodiment of a voltage configuration selector.

FIG. 3 illustrates an example embodiment of a voltage configuration selector 100. The voltage configuration selector 100 inputs a stepped down version of the voltages (approximately in the range of 5 V in some instances) on conductors A, B, and C. The level of scaling that is done on the conductor voltages may vary depending on the capabilities of other components used in the voltage configuration selector 100. The voltage configuration selector 100 outputs sensing voltages $V_1, V_2, V_3$ that are in a selected voltage configuration and are appropriate for input to a power calculation component (not shown in FIG. 3).

The voltage configuration selector 100 includes a virtual ground (shown as separate input grounds 120, 122, 124) that provides a ground path for the stepped down voltages on conductors A, B, and C. The virtual ground may be provided internally and may approximate a potential of the neutral line in a wye voltage configuration. By providing this virtual ground, the voltage configuration selector 100 creates wye voltages $V_{Y1}, V_{Y2}, V_{Y3}$ that approximate a wye voltage for each conductor A, B, and C without connection to a neutral line. The wye voltages $V_{Y1}, V_{Y2}, V_{Y3}$ are input to an output voltage selector 150.

The voltage configuration selector 100 includes first, second, and third voltage differentiators 130, 134, 137. In the illustrated embodiment, the voltage differentiators are operational amplifiers 131, 135, 138, and associated resistors, which are connected in a closed loop configuration as shown. Each voltage differentiator inputs two of the wye voltages and outputs a difference between the wye voltages as a delta voltage. For example, the first voltage differentiator 130 inputs $V_{Y1}$ and $V_{Y2}$ and outputs the difference as $V_{A1}$. Likewise, the second voltage differentiator 134 inputs $V_{Y2}$ and $V_{Y3}$ and outputs the difference as $V_{A2}$ and the third voltage differentiator 137 inputs $V_{Y3}$ and $V_{Y1}$ and outputs the difference as $V_{A3}$. The delta voltages $V_{A1}, V_{A2}, V_{A3}$ are input to the output voltage selector 150.

The output voltage selector 150 selects either the wye voltages $V_{Y1}, V_{Y2}, V_{Y3}$ or the delta voltages $V_{A1}, V_{A2}, V_{A3}$ to output to a power calculation component. In one example embodiment, the output voltage selector 150 is an analog multiplexer that selects includes a selector 151 that actuates a gang of switches 152 to select between $V_{Y1}, V_{Y2}, V_{Y3}$ Or $V_{A1}, V_{A2}, V_{A3}$ for output as $V_{1a}, V_{2a}, V_{3a}$. The selector may be a dip switch or other mechanical means or may respond to an electronic input. Further scaling can be done on the voltages output by the output voltage selector 150 by scaling circuits 160, 160', 160". Thus, by manipulating the selector, the appropriate voltage configuration for a given load can be easily selected, and changed, as necessary.

While the foregoing description described operation of a voltage configuration selector as used with all three phases of a three phase power, it is to be understood that the voltage configuration selector may be employed with less than three phases.

Figure 4:
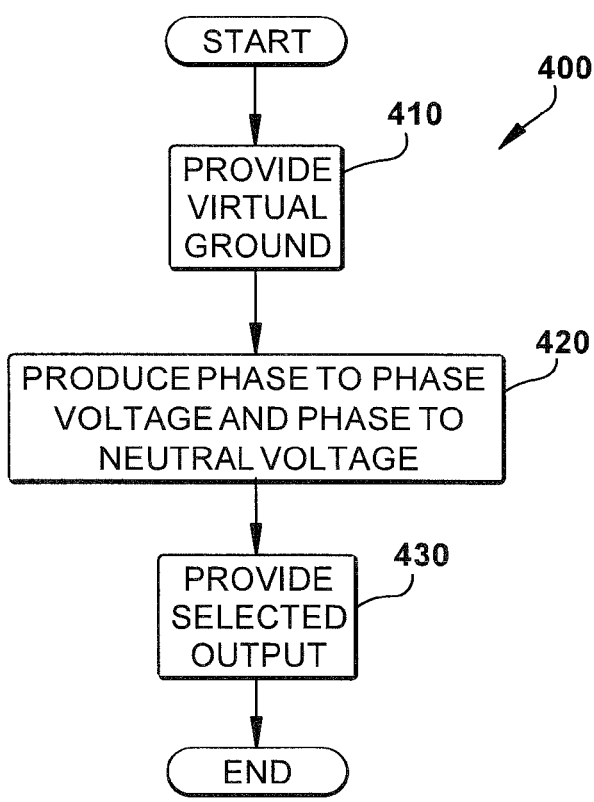
FIG. 4 is a flowchart that outlines an example embodiment of a voltage configuration selection method.

FIG. 4 is a flowchart that outlines an example embodiment of a voltage configuration selection method 400. At 410 a virtual ground is provided for first, second, and third input voltages, respectively, of a multiphase voltage being supplied to the load, to produce first, second, and third wye voltages, respectively. At 420, a first delta voltage comprising a difference between the first and second wye voltages, a second delta voltage comprising a difference between the second and third wye voltages, and a third delta voltage comprising a difference between the third and first wye voltages are produced. At 430 either the first, second, and third wye voltages or the first, second, and third delta voltages are output, as selected.

In some embodiments, the current being supplied to the load is measured on each phase of the multiphase voltage being supplied to the load and an amount of power being consumed by the load is calculated based on the measured current and the first, second, and third wye voltages or the first, second, and third delta voltages selected that are selectively output.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

What is claimed is:

1. A voltage configuration selector comprising:
   a virtual ground for first and second input voltages, respectively, of a multiphase voltage being supplied to a load, where the first and second input voltages, with respect to the virtual ground, produce first and second wye voltages, respectively;
   a first voltage differentiator configured to input the first and second wye voltages, calculates a difference between the first and second wye voltages, and outputs a first delta voltage comprising the difference between the first and second wye voltages;
   a selector that is actuable to select one of a delta voltage mode or a wye voltage mode; and
   an output voltage selector configured to receive the first wye voltage and the first delta voltage, and output the first wye voltage when the wye voltage mode is selected and the first delta voltage when the delta voltage mode is selected.

2. The voltage configuration selector of claim 1 where the virtual ground provides a virtual ground for a third input voltage of the multiphase voltage being supplied to the load where the third input voltage, with respect to the virtual ground, produces a third wye voltage, the method comprising:
   a second voltage differentiator that inputs the second and third wye voltages, calculates a difference between the second and third wye voltages, and outputs a second delta voltage comprising the difference between the second and third wye voltages;
   a third voltage differentiator that inputs the third and first wye voltages, calculates a difference between the third and first wye voltages, and outputs a third delta voltage comprising the difference between the third and first wye voltages; and
   wherein the output voltage selector is configured to receive the first, second, and third wye voltages and the first, second, and third delta voltages and selectively outputs the first, second, and third wye voltages when the wye voltage mode is selected and the first, second, and third delta voltages for output when the delta voltage mode is selected.

3. The voltage configuration selector of claim 1 where the virtual ground is configured to have a voltage potential approximately equal to a potential of a wye neutral for a power source that supplies the first input voltage.

4. The voltage configuration selector of claim 1 where the first voltage differentiator comprises an operational amplifier connected in a closed loop configuration with the first and second wye voltages as inputs.

5. The voltage configuration selector of claim 1 where the output voltage selector comprises an analog multiplexer that inputs the first wye voltage and the first delta voltage and selectively outputs either the first wye voltage or the first delta voltage.

6. The voltage configuration selector of claim 1 comprising a first output voltage scaling circuit that scales the output of the output voltage selector for input to a power calculation component.

7. A power meter that calculates power being supplied to a load comprising:
   an ammeter that measures current being supplied to the load on a phase of a multiphase voltage being supplied to a load and provides a current signal indicative of the measured current;
   a selector that is actuable to select one of a delta voltage mode or a wye voltage mode;
   a voltage configuration selector that provides a voltage signal indicative of the voltage being supplied by a phase of the multiphase voltage being supplied to the load, where the voltage configuration selector is configured to generate both a wye voltage and a delta voltage from the voltage supplied by the phase and a virtual ground provided by the voltage configuration selector without using a transformer, and to selectively output for the phase, a voltage signal corresponding to the wye voltage when the wye voltage mode is selected and the delta voltage when the delta voltage mode is selected; and
   a power calculation component that calculates the power being consumed by the load based, at least in part, on the current signal and the voltage signal.

8. The power meter of claim 7 where the voltage configuration selector comprises:
   a virtual ground for first, second, and third input voltages, respectively, of a multiphase voltage being supplied to the load, to produce the first wye voltage, and second and third wye voltages, respectively;
   a first voltage differentiator that inputs the first and second wye voltages and outputs a first delta voltage comprising a difference between the first and second wye voltages;
   a second voltage differentiator that inputs the second and third wye voltages and outputs a second delta voltage comprising a difference between the second and third wye voltages;
   a third voltage differentiator that inputs the third and first wye voltages and outputs a third delta voltage comprising a difference between the third and first wye voltages; and
   an output voltage selector that receives the first, second, and third wye voltages and the first, second, and third delta voltages and selectively outputs the first, second, and third wye voltages when the wye voltage mode is selected and the first, second, and third delta voltages when the delta voltage mode is selected.

9. The power meter of claim 8 where the first, second, and third voltage differentiators comprise operational amplifiers connected in a closed loop configuration with the first and second wye voltages, second and third wye voltages, and third and first wye voltages, respectively, as inputs.

10. The power meter of claim 8 where the output voltage selector comprises an analog multiplexer that inputs the first, second, and third wye voltages and the first, second, and third delta voltages and selectively outputs either the first, second, and third wye voltages or the first, second, and third delta voltages.

11. A method comprising:
providing a virtual ground for first, second, and third input voltages, respectively, of a multiphase voltage being supplied to a load, to produce first, second, and third wye voltages between the first, second, and third input voltages and the virtual ground, respectively;
calculating a difference between the first and second wye voltages to produce a first delta voltage;
calculating a difference between the second and third wye voltages to produce a second delta voltage;
calculating a difference between the third and first wye voltages to produce a third delta voltage;
receiving a voltage configuration selection that specifies either a wye configuration or a delta configuration; and
based, at least in part, on the received voltage configuration selection, outputting either the first, second, and third wye voltages or the first, second, and third delta voltages.

12. The method of claim 11 where the producing of the first, second, and third delta voltages is performed by inputting the first and second, second and third, and third and first wye voltages into first, second, and third operational amplifiers, respectively.

13. The method of claim 11 where the selectively outputting is performed by inputting the first, second, and third wye voltages and the first, second, and third delta voltages to an analog multiplexer that selects one of the first wye voltage and first delta voltage, one of the second wye voltage and second delta voltage, and one of the third wye voltage and third delta voltage to output.

14. The method of claim 11 comprising:
measuring current being supplied to the load on each phase of the multiphase voltage being supplied to the load; and
calculating an amount of power being consumed by the load based on the measured current and the first, second, and third wye voltages or the first, second, and third delta voltages selected that are selectively output.

15. An apparatus comprising:
means for providing a virtual ground for first, second, and third input voltages, respectively, of a multiphase voltage being supplied to the load, to produce first, second, and third wye voltages, respectively;
means for calculating a difference between the first and second wye voltages to produce a first delta voltage;
means for calculating a difference between the second and third wye voltages to produce a second delta voltage;
means for calculating a difference between the third and first wye voltages to produce a third delta voltage;
means for receiving a voltage configuration selection that specifies either a wye configuration or a delta configuration; and
means for selectively outputting either the first, second, and third wye voltages or the first, second, and third delta voltages based on the received voltage configuration selection.

* * * * *